United States Patent
Yabe et al.

(10) Patent No.: US 9,552,981 B2
(45) Date of Patent: Jan. 24, 2017

(54) METHOD AND APPARATUS FOR FORMING METAL OXIDE FILM

(71) Applicant: TOKYO ELECTRON LIMITED, Tokyo (JP)

(72) Inventors: Kazuo Yabe, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/613,541

(22) Filed: Feb. 4, 2015

(65) Prior Publication Data
US 2015/0228473 A1 Aug. 13, 2015

(30) Foreign Application Priority Data
Feb. 10, 2014 (JP) ................. 2014-023148

(51) Int. Cl.
| | | |
|---|---|---|
| H01L 21/02 | (2006.01) |
| C23C 16/455 | (2006.01) |
| H01L 29/51 | (2006.01) |
| H01L 21/28 | (2006.01) |
| C23C 16/40 | (2006.01) |
| C23C 16/56 | (2006.01) |

(52) U.S. Cl.
CPC ......... *H01L 21/0228* (2013.01); *C23C 16/403* (2013.01); *C23C 16/45523* (2013.01); *C23C 16/45553* (2013.01); *C23C 16/56* (2013.01); *H01L 21/02178* (2013.01); *H01L 21/02337* (2013.01); *H01L 21/28229* (2013.01); *H01L 29/517* (2013.01)

(58) Field of Classification Search
CPC ............. H01L 21/02178; H01L 21/28229; H01L 21/0228; H01L 21/02337
See application file for complete search history.

(56) References Cited

U.S. PATENT DOCUMENTS

2011/0130011 A1* 6/2011 Sasajima .............. C23C 16/402
                                                                438/770
2011/0197813 A1* 8/2011 Ishida .................... C23C 16/40
                                                                118/704

FOREIGN PATENT DOCUMENTS

| JP | 2003-193243 A | 7/2003 |
|---|---|---|
| JP | 2004-047634 A | 2/2004 |
| JP | 2006-080474 A | 3/2006 |
| JP | 2008-027932 A | 2/2008 |
| JP | 2012-134311 A | 7/2012 |
| WO | 2010044430 A1 | 4/2010 |

* cited by examiner

Primary Examiner — Caleb Henry
Assistant Examiner — Mounir Amer
(74) Attorney, Agent, or Firm — Nath, Goldberg & Meyer; Jerald L. Meyer

(57) ABSTRACT

A metal oxide film forming method includes: repeating a cycle a first predetermined number of times, the cycle including supplying a gas containing an organic metal precursor into a processing chamber where an object to be processed is accommodated, and supplying oxygen gas into the processing chamber after the gas containing the organic metal precursor is supplied into the processing chamber; and supplying ozone gas into the processing chamber, wherein repeating the cycle and supplying the ozone gas are repeated a second predetermined number of times, so that a metal oxide film is formed on a surface of the object to be processed.

6 Claims, 12 Drawing Sheets

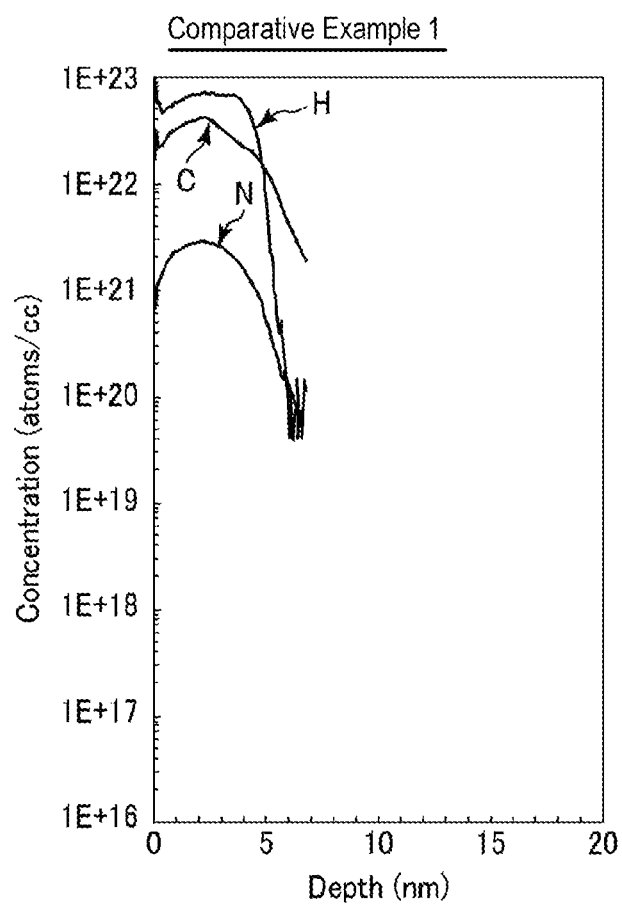

METHOD AND APPARATUS FOR FORMING METAL OXIDE FILM

CROSS-REFERENCE TO RELATED APPLICATION

This application claims the benefit of Japanese Patent Application No. 2014-023148, filed on Feb. 10, 2014, in the Japan Patent Office, the disclosure of which is incorporated herein in its entirety by reference.

TECHNICAL FIELD

The present disclosure relates to a method and apparatus for forming a metal oxide film.

BACKGROUND

Recently, aluminum oxide ($Al_2O_3$) has come into the spotlight as a gate insulating film of a transistor or a dielectric of a capacitor. The aluminum oxide has a specific permittivity of about 9 to 11 which exceeds two times a specific permittivity of $SiO_2$, about 3.9. For this reason, as compared with $SiO_2$, the aluminum oxide enables a thin gate insulating film to be formed while suppressing a tunneling current, thereby further contributing to miniaturization of a transistor.

There is a transistor in which aluminum oxide is used for a gate insulating film. In such a transistor, $Al_2O_3$ is grown by alternately supplying trimethyl aluminum (TMA: $Al(CH_3)_3$) and ozone ($O_3$) within an ALD apparatus, thereby forming the gate insulating film.

In the aforementioned transistor, $O_3$ having high oxidizing power is used as an oxidizing agent for an aluminum film. For this reason, there is an advantage in that although organic aluminum such as TMA is used as a source of the aluminum film, an aluminum oxide film having low carbon concentration can be obtained.

However, since the aluminum film is oxidized using $O_3$ having high oxidizing power, uniformity in film thickness is deteriorated, for example, as compared with a case where the aluminum film is oxidized using $O_2$.

SUMMARY

Some embodiments of the present disclosure provide a metal oxide film forming method, wherein a metal oxide film having a low concentration of an impurity such as carbon can be obtained without damaging uniformity in film thickness, and a film forming apparatus capable of performing the method.

According to one embodiment of the present disclosure, there is provided a metal oxide film forming method including: repeating a cycle a first predetermined number of times, the cycle including supplying a gas containing an organic metal precursor into a processing chamber where an object to be processed is accommodated, and supplying oxygen gas into the processing chamber after the gas containing the organic metal precursor is supplied into the processing chamber; and supplying ozone gas into the processing chamber, wherein repeating the cycle and supplying the ozone gas are repeated a second predetermined number of times, so that a metal oxide film is formed on a surface of the object to be processed.

According to another embodiment of the present disclosure, there is provided an apparatus for forming a metal oxide film on a surface of an object to be processed using an organic metal precursor, the apparatus including: a processing chamber that accommodates the object to be processed; a gas supply mechanism that supplies an organic metal precursor containing gas, oxygen gas and ozone gas into the processing chamber; a heating unit that heats an interior of the processing chamber; an exhaust unit that exhausts the interior of the processing chamber; and a controller that controls the gas supply mechanism, the heating unit and the exhaust unit, wherein the controller controls the gas supply mechanism, the heating unit and the exhaust unit so that the aforementioned method is performed on the object to be processed in the processing chamber.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 3A to 3C illustrate analysis results on impurities in aluminum oxide films of comparative examples by means of SIMS.

DETAILED DESCRIPTION

Figure 1:
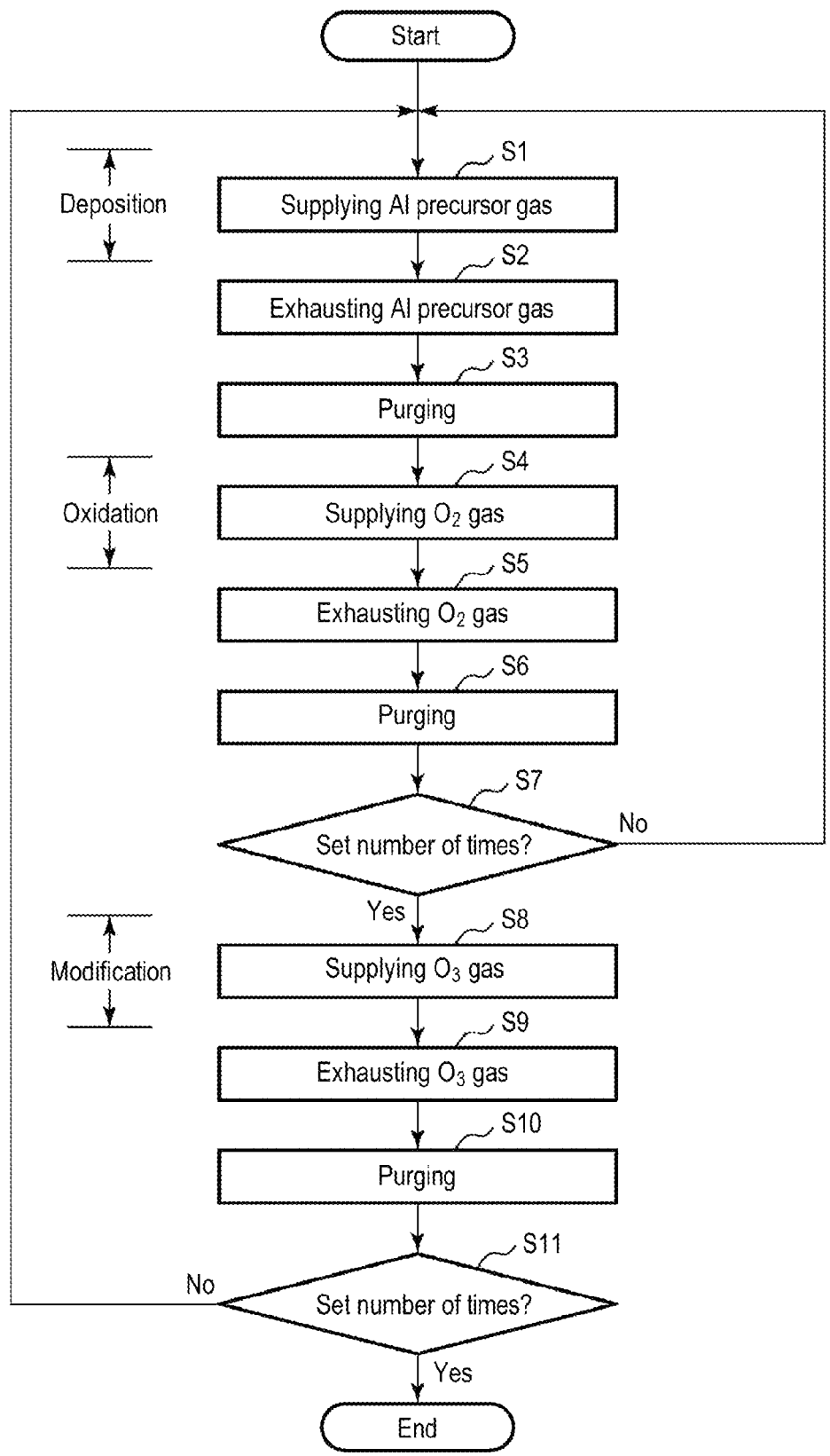
FIG. 1 is a flowchart illustrating an example of a metal oxide film forming method according to a first embodiment of the present disclosure.

Hereinafter, some embodiments of the present disclosure will be described with reference to the accompanying drawings. Throughout the drawings, like reference numerals are used to designate like elements. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

Film Forming Method

FIG. 1 is a flowchart illustrating an example of a metal oxide film forming method according to a first embodiment of the present disclosure. FIGS. 2A to 2L are sectional views schematically illustrating a state of an object to be processed in the sequence shown in FIG. 1.

Figure 2A:
FIGS. 2A to 2L are sectional views schematically illustrating a state of an object to be processed in the sequence shown in FIG. 1.

First, an object to be processed is accommodated in a processing chamber of a film forming apparatus. An example of the object to be processed is a silicon wafer (hereinafter, referred to as a wafer) 1, as shown in FIG. 2A.

Figure 2B:
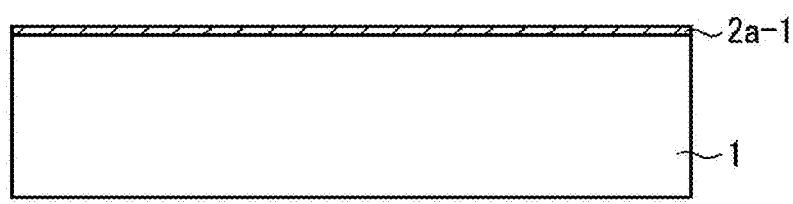

Subsequently, as shown in Step S1 of FIG. 1, an organic metal precursor, e.g., a gas containing organic aluminum (an Al precursor gas), is supplied into the processing chamber where the wafer 1 is accommodated. An example of the organic aluminum is $C_{11}H_{29}N_4Al$ ((2-dimethylaminoethyl-methylamino)bis(ethylmethylamino)aluminum). Accordingly, as shown in FIG. 2B, aluminum is deposited on a surface to be processed of the wafer 1, thereby forming a first aluminum layer 2a-1.

An example of processing conditions in Step S1 is as follows:

Flow Rate of $C_{11}H_{29}N_4Al$: 1000 sccm (Carrier Gas: Nitrogen ($N_2$))

Processing Time: 10 to 30 sec

Processing Temperature: Room Temperature (25 degrees C.) to 350 degrees C.

Processing Pressure: 53.3 Pa (0.4 Torr)

Subsequently, the Al precursor gas is exhausted from the processing chamber as shown in Step S2 of FIG. 1, and the processing chamber is then purged by an inert gas as shown in Step S3 of FIG. 1.

Figure 2C:
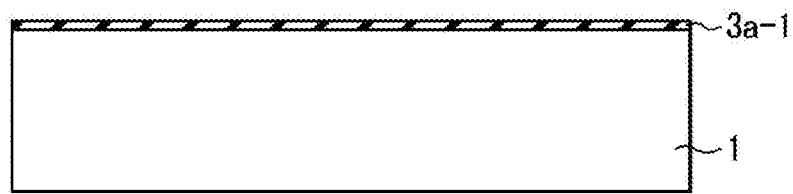
Figure 2D:
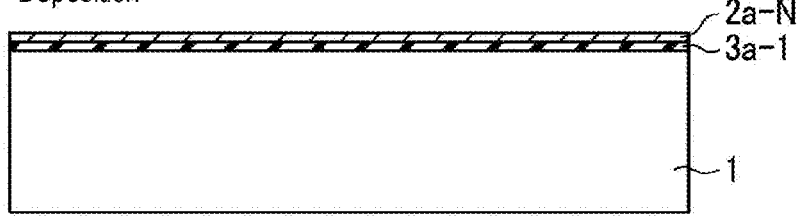
Figure 2E:
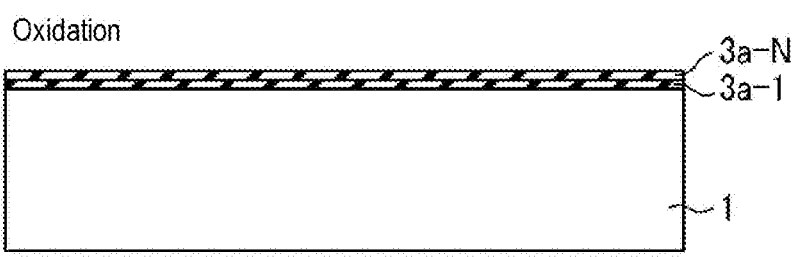

Subsequently, as shown in Step S4 of FIG. 1, oxygen gas ($O_2$ gas) is supplied into the processing chamber. Accordingly, as shown in FIG. 2C, the first aluminum layer 2a-1 is oxidized into a first aluminum oxide ($Al_2O_3$) layer 3a-1.

An example of processing conditions in Step S4 is as follows:

Flow Rate of Oxygen: 6500 to 10000 sccm

Processing Time: 15 to 30 sec

Processing Temperature: Room Temperature (25 degrees C.) to 350 degrees C.

Processing Pressure: 133.3 Pa (1 Torr)

Subsequently, the oxygen gas is exhausted from the processing chamber as shown in Step S5 of FIG. 1, and the processing chamber is then purged by an inert gas as shown in Step S6 of FIG. 1.

Subsequently, as shown in Step S7 of FIG. 1, it is determined whether a set of Steps S1 to S6 is repeated a set number of times. When a number of times the set of Step S1 to S6 being repeated does not reach the set value (No), the process returns to Step S1, and the set of Steps S1 to S6 is repeated. In this manner, a first aluminum layer 2a-N as an N-th layer is formed on the first aluminum oxide layer 3a-1 (see FIG. 2D) and oxidized into a first aluminum oxide layer 3a-N as the N-th layer (see FIG. 2E), where N is a natural number equal to or larger than 2.

Figure 2F:
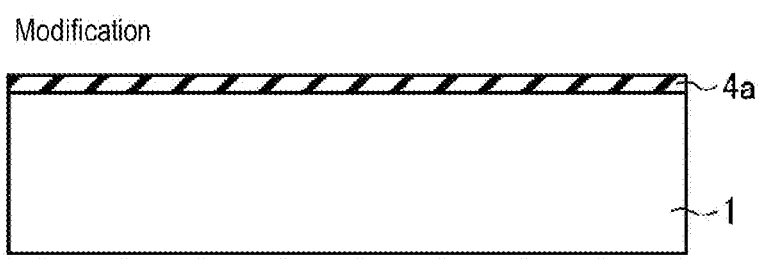
Figure 2G:
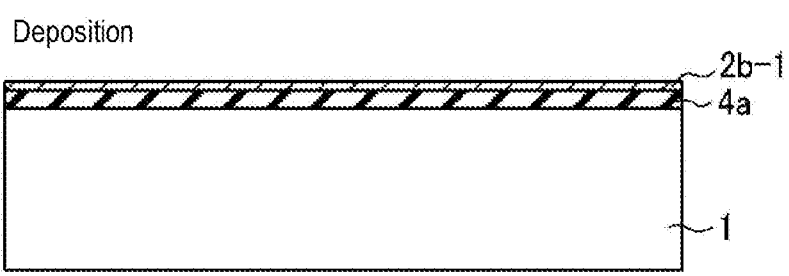

In Step S7, when the number of times the set of Step S1 to S6 being repeated reaches the set value (Yes), the process proceeds to Step S8. As shown in Step S8 of FIG. 1, ozone gas ($O_3$ gas) is supplied into the processing chamber. Accordingly, as shown in FIG. 2F, the first aluminum oxide layer 3a-1 to the first aluminum oxide layer 3a-N as the N-th layer are modified into a first modified aluminum oxide layer 4a.

An example of processing conditions in Step S8 is as follows:

Flow Rate of Ozone: 6500 to 10000 sccm

Processing Time: 60 to 120 sec

Processing Temperature: Room Temperature (25 degrees C.) to 350 degrees C.

Processing Pressure: 133.3 Pa (1 Torr)

Subsequently, the ozone gas is exhausted from the processing chamber as shown in Step S9 of FIG. 1, and the processing chamber is then purged by an inert gas as shown in Step S10 of FIG. 1.

Subsequently, as shown in Step S11 of FIG. 1, it is determined whether the number of times a set of Steps S8 to S10 is repeated is a set number of times. When the number of times being repeated does not reach a set value (No), the process returns to Step S1, and the set of Steps S1 to S6 and the set of Steps S8 to S10 are repeated.

Figure 2H:
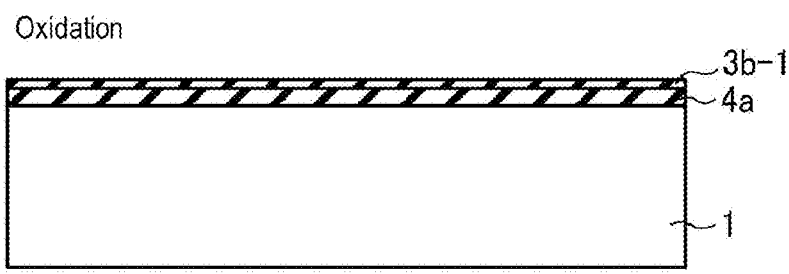
Figure 2I:
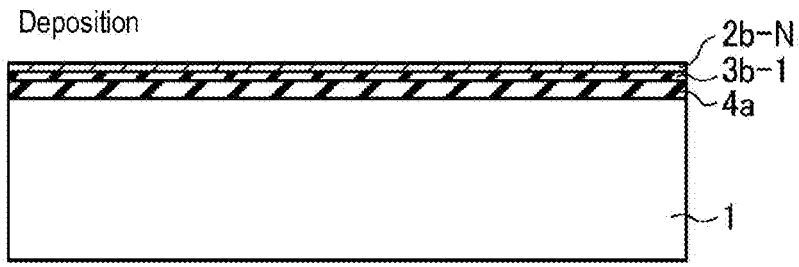
Figure 2J:
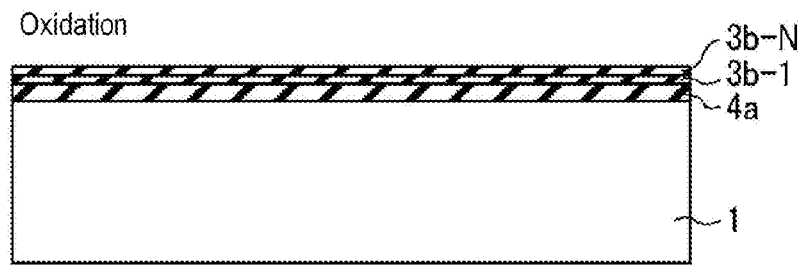
Figure 2K:

Accordingly, a second aluminum layer 2b-1 is formed on the first modified aluminum oxide layer 4a (see FIG. 2G) and is oxidized into a second aluminum oxide layer 3b-1 (see FIG. 2H). Also, a second aluminum layer 2b-N as an N-th layer is formed on the second aluminum oxide layer 3b-1 (see FIG. 2I) and oxidized into a second aluminum oxide layer 3b-N as the N-th layer (see FIG. 2J). Then, the second aluminum oxide layer 3b-1 to the second aluminum oxide layer 3b-N as the N-th layer are modified into a second modified aluminum oxide layer 4b (see FIG. 2K).

Figure 2L:
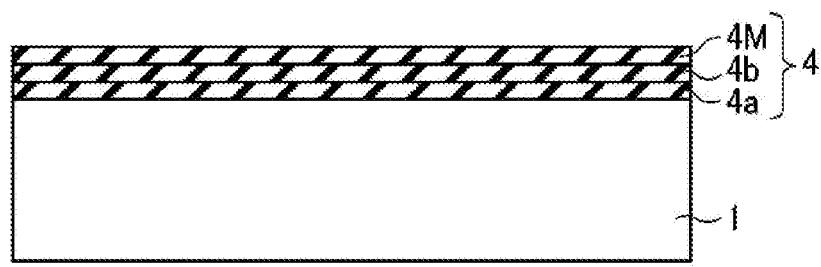

In Step S11, when the number of times being repeated reaches the set value (Yes), the metal oxide film forming method according to the first embodiment is finished. In this manner, finally, as shown in FIG. 2L, an aluminum oxide film 4 consisting of the first modified aluminum oxide layer 4a to an M-th modified aluminum oxide layer 4M, where M is a natural number equal to or larger than 2, is formed on the surface to be processed of the wafer 1.

<Analysis Result on Impurities in Aluminum Oxide Film 4>

Subsequently, analysis results on impurities in the aluminum oxide film 4 will be described.

Figure 3B:
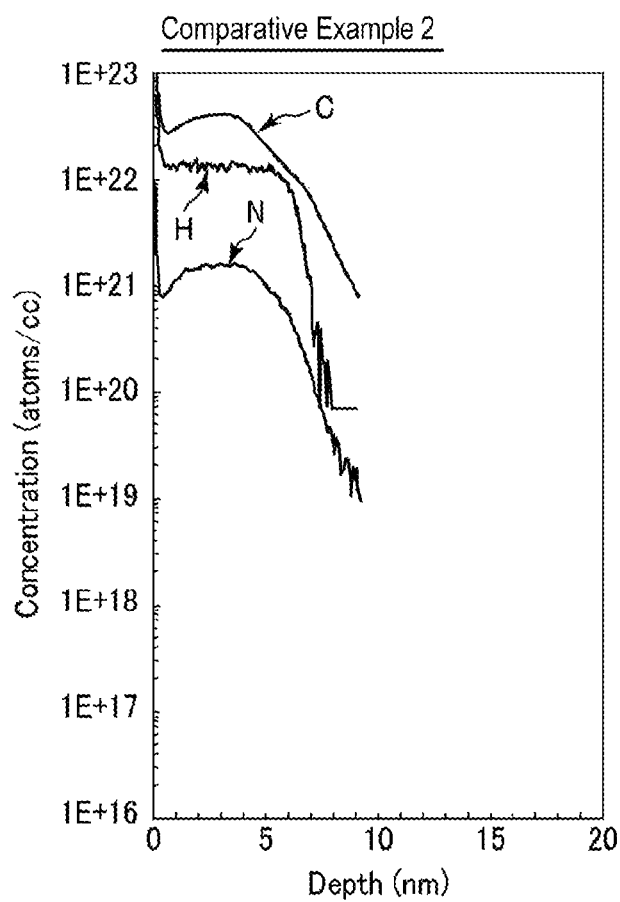
Figure 3C:
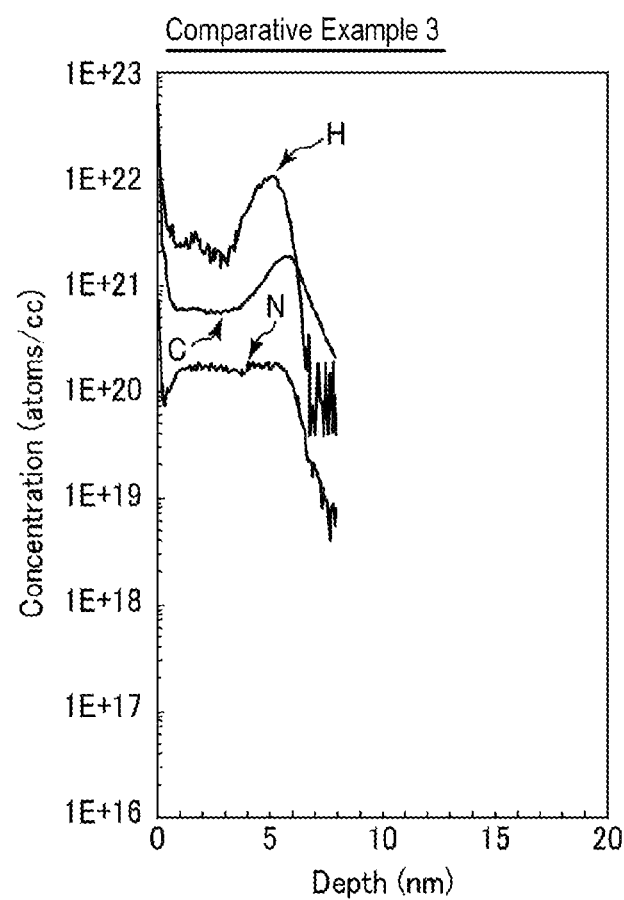
Figure 4A:
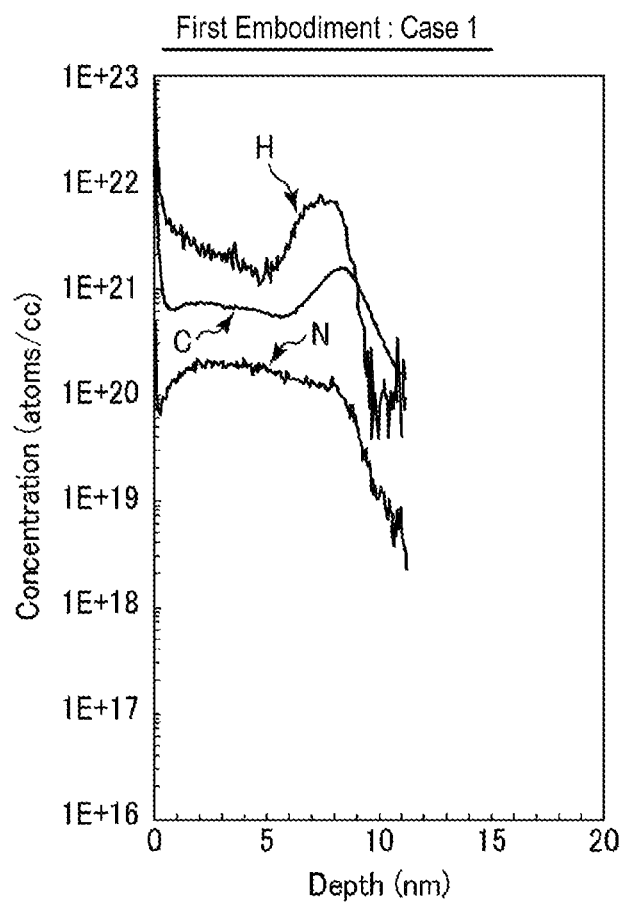
FIG. 4A to 4C illustrate analysis results on impurities in aluminum oxide films of the first embodiment of the present disclosure by means of SIMS.
Figure 4B:
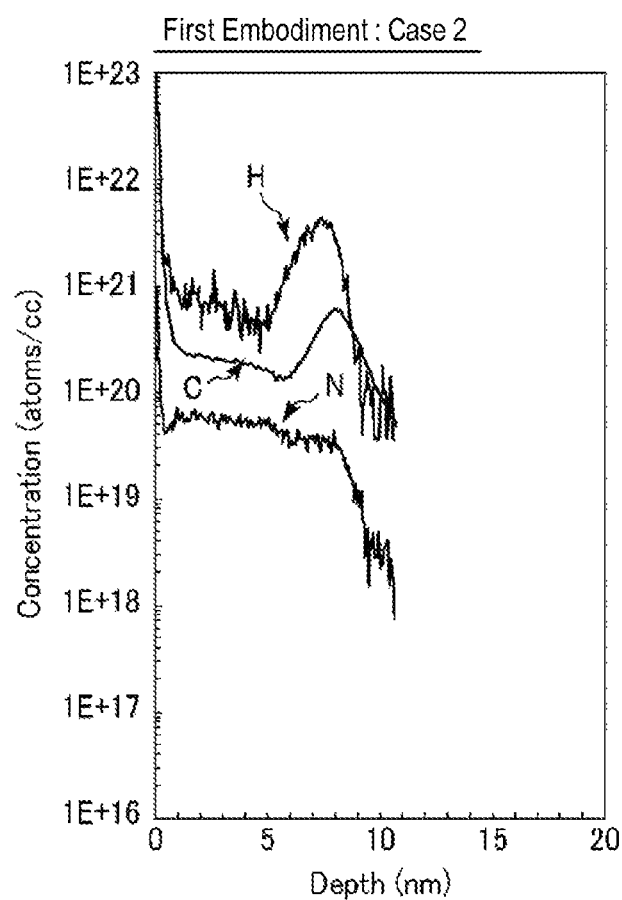
Figure 4C:
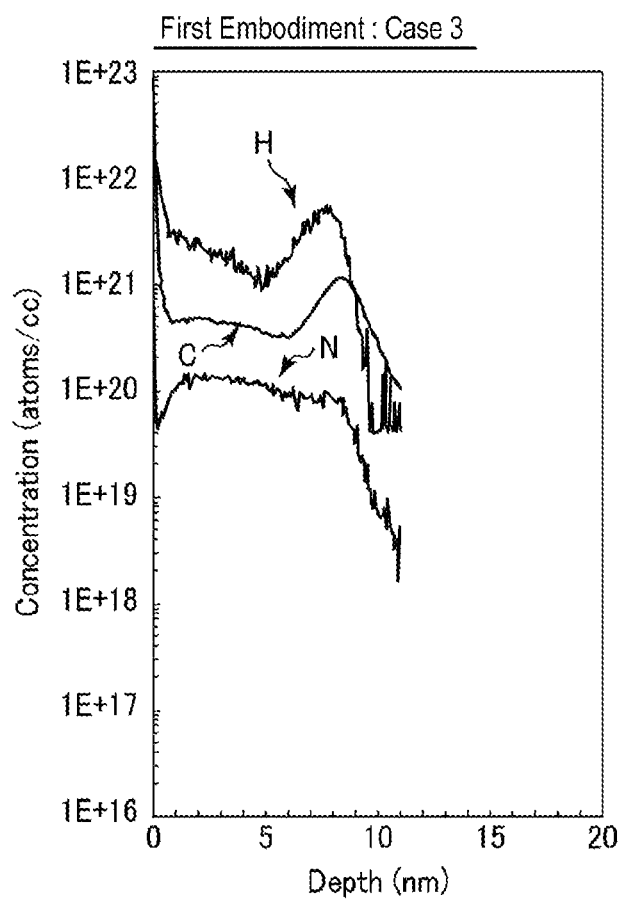

FIGS. 3A to 3C and 4A to 4C illustrate analysis results of impurities in the aluminum oxide film 4 by means of secondary ion mass spectroscopy (SIMS). FIGS. 3A to 3C illustrate comparative examples in which the ozone modification process in Step S8 is not performed. FIGS. 4A to 4C illustrate examples according to the first embodiment in which the ozone modification process in Step S8 is performed.

Comparative Example 1

FIG. 3A illustrates a result of Comparative Example 1, in which the aluminum layer was oxidized using oxygen gas at a temperature of 300 degrees C. but the ozone modification process was not performed.

As shown in FIG. 3A, Comparative Example 1 shows a carbon (C) concentration and a hydrogen (H) concentration on the order of $10^{22}$ atoms/cc and a nitrogen (N) concentration on the order of $10^{20}$ to $10^{21}$ atoms/cc in the range up to a depth of 5 nm.

Comparative Example 2

FIG. 3B illustrates a result of Comparative Example 2, in which the aluminum layer was oxidized using oxygen gas at a temperature of 350 degrees C. but the ozone modification process was not performed.

As shown in FIG. 3B, in Comparative Example 2, in the range up to a depth of 5 nm, the hydrogen (H) concentration is decreased as compared with Comparative Example 1, but the carbon (C) concentration or the nitrogen (N) concentration is not remarkably improved as compared with Comparative Example 1.

Comparative Example 3

FIG. 3C illustrates a result of Comparative Example 3, in which the aluminum layer was oxidized using ozone gas at a temperature of 300 degrees C. but the ozone modification process was not performed.

As shown in FIG. 3C, Comparative Example 3 shows a carbon (C) concentration on the order of $10^{20}$ atoms/cc, a hydrogen (H) concentration on the order of $10^{21}$ atoms/cc, and a nitrogen (N) concentration on the order of $10^{20}$ atoms/cc in the range up to a depth of 5 nm, which are improved by about one digit order as compared with Comparative Examples 1 and 2. However, since the aluminum layer is oxidized using ozone gas, uniformity in film thickness is deteriorated as compared with Comparative Examples 1 and 2 in which the aluminum layer is oxidized using oxygen gas.

First Embodiment

Case 1

FIG. 4A illustrates a result of Case 1, in which the aluminum layer was oxidized using oxygen gas at a temperature of 300 degrees C. and the ozone modification process was performed using ozone gas at a temperature of 300 degrees C. for 60 sec.

As shown in FIG. 4A, Case 1 shows a carbon (C) concentration on the order of $10^{20}$ atoms/cc, a hydrogen (H) concentration on the order of $10^{21}$ atoms/cc, and a nitrogen (N) concentration on the order of $10^{20}$ atoms/cc in the range up to a depth of 5 nm That is to say, concentration of impurities is improved up to the same concentration level as observed in Comparative Example 3 in which the oxidization is performed using ozone gas. Also, since the aluminum layer is oxidized using oxygen gas, the uniformity in film thickness in Case 1 has the same uniformity level as can be provided in Comparative Examples 1 and 2 in which the aluminum layer is oxidized using oxygen gas.

First Embodiment

Case 2

FIG. 4B illustrates a result of Case 2, in which the aluminum layer was oxidized using oxygen gas at a temperature of 350 degrees C. and the ozone modification process was performed using ozone gas at a temperature of 350 degrees C. for 60 sec.

As shown in FIG. 4B, in Case 2 in which the oxidation temperature and the modification process temperature are increased as compared with Case 1, in the range up to a depth of 5 nm, the respective concentrations of carbon (C), hydrogen (H) and nitrogen (N) are further improved as compared with Case 1. Case 2 shows a carbon (C) concentration on the order of $10^{20}$ atoms/cc, a hydrogen (H) concentration on the order of $10^{20}$ atoms/cc, and a nitrogen (N) concentration on the order of $10^{19}$ atoms/cc.

First Embodiment

Case 3

FIG. 4C illustrates a result of Case 3, in which the aluminum layer was oxidized using oxygen gas at a temperature of 300 degrees C. and the ozone modification process was performed using ozone gas at a temperature of 300 degrees C. for 120 sec.

As shown in FIG. 4C, in Case 3 in which the modification process time is extended as compared with Case 1, in the range up to a depth of 5 nm, the respective concentrations of carbon (C) and nitrogen (N) are slightly improved as compared with Case 1. Case 3 shows a carbon (C) concentration on the order of $10^{20}$ atoms/cc, a hydrogen (H) concentration on the order of $10^{21}$ atoms/cc, and a nitrogen (N) concentration on the order of $10^{19}$ to $10^{20}$ atoms/cc.

<Film Density Analysis Result of Aluminum Oxide Film 4>

Subsequently, film density analysis results of the aluminum oxide film 4 will be described.

Figure 5:
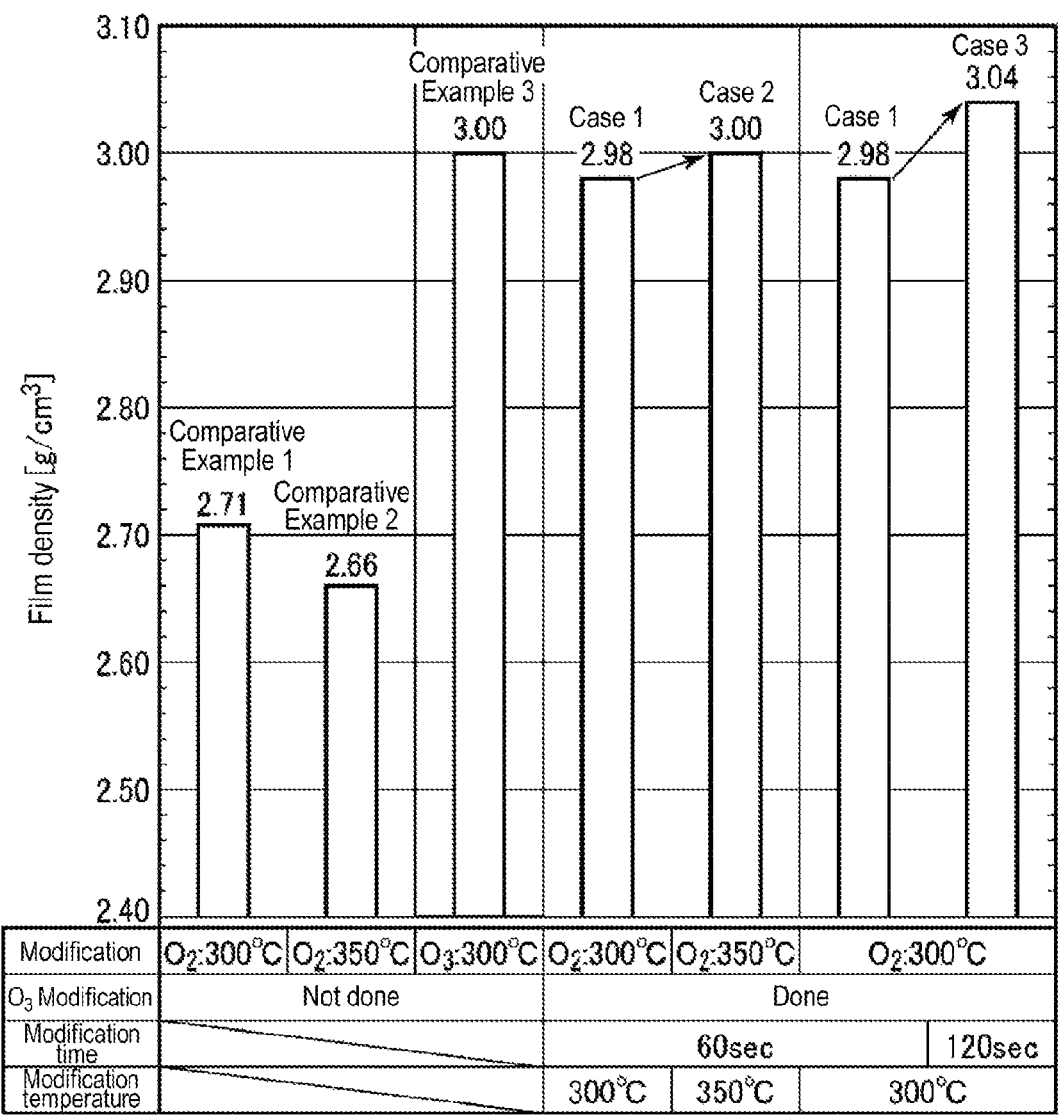
FIG. 5 illustrates analysis results on film density of aluminum oxide films by means of XRR.

FIG. 5 illustrates film density analysis results of the aluminum oxide film 4 by means of X-ray reflectometry (XRR).

Comparative Examples 1 and 2

As shown in FIG. 5, Comparative Examples 1 and 2 in which the aluminum layer is oxidized using oxygen gas, show a film density of 2.66 to 2.71 $g/cm^3$, which is low.

Comparative Example 3

Comparative Example 3, in which the aluminum layer is oxidized using ozone gas, shows a film density of 3.00 $g/cm^3$, which is improved as compared with Comparative Examples 1 and 2. However, as described above, the uniformity in film thickness in Comparative Example 3 is deteriorated as compared with Comparative Examples 1 and 2 in which the aluminum layer is oxidized using oxygen gas.

First Embodiment

Case 1

Case 1, in which the aluminum layer is oxidized using oxygen gas at a temperature of 300 degrees C. and the ozone modification process is performed using ozone gas at 300 degrees C. for 60 sec, shows a film density of 2.98 $g/cm^3$, which is improved by 0.27 $g/cm^3$ as compared with Comparative Example 1, and substantially equal to Comparative Example 3.

First Embodiment

Case 2

Case 2, in which the oxidation temperature and the ozone modification process temperature are increased by 50 degrees C. as compared with Case 1, shows a film density improved by 0.02 $g/cm^3$ as compared with Case 1. From this result, it can be known that increasing the ozone modification process temperature, in particular, is effective in improving the film density.

First Embodiment

Case 3

Case 3, in which the ozone modification process time is extended by 60 sec as compared with Case 1, shows a film density improved by 0.06 $g/cm^3$ as compared with Case 1. From this result, it can be seen that extending the ozone modification process time is also effective in improvement of the film density.

According to the metal oxide film forming method of the first embodiment, a modification process using ozone gas is repeated until aluminum layers are stacked up to a set thickness thereby forming an aluminum oxide film having the set film thickness. The metal oxide film forming method of the first embodiment has advantageous effects that the concentration of impurities such as carbon can be reduced without damaging uniformity in thin film thickness and that it is possible to obtain an aluminum oxide film having high film density and good film quality, for example, with low leakage current or the like.

Second Embodiment

Film Forming Apparatus

Subsequently, a film forming apparatus capable of performing the metal oxide film forming method in accordance with the first embodiment of the present disclosure will be described as a second embodiment of the present disclosure.

Figure 6:
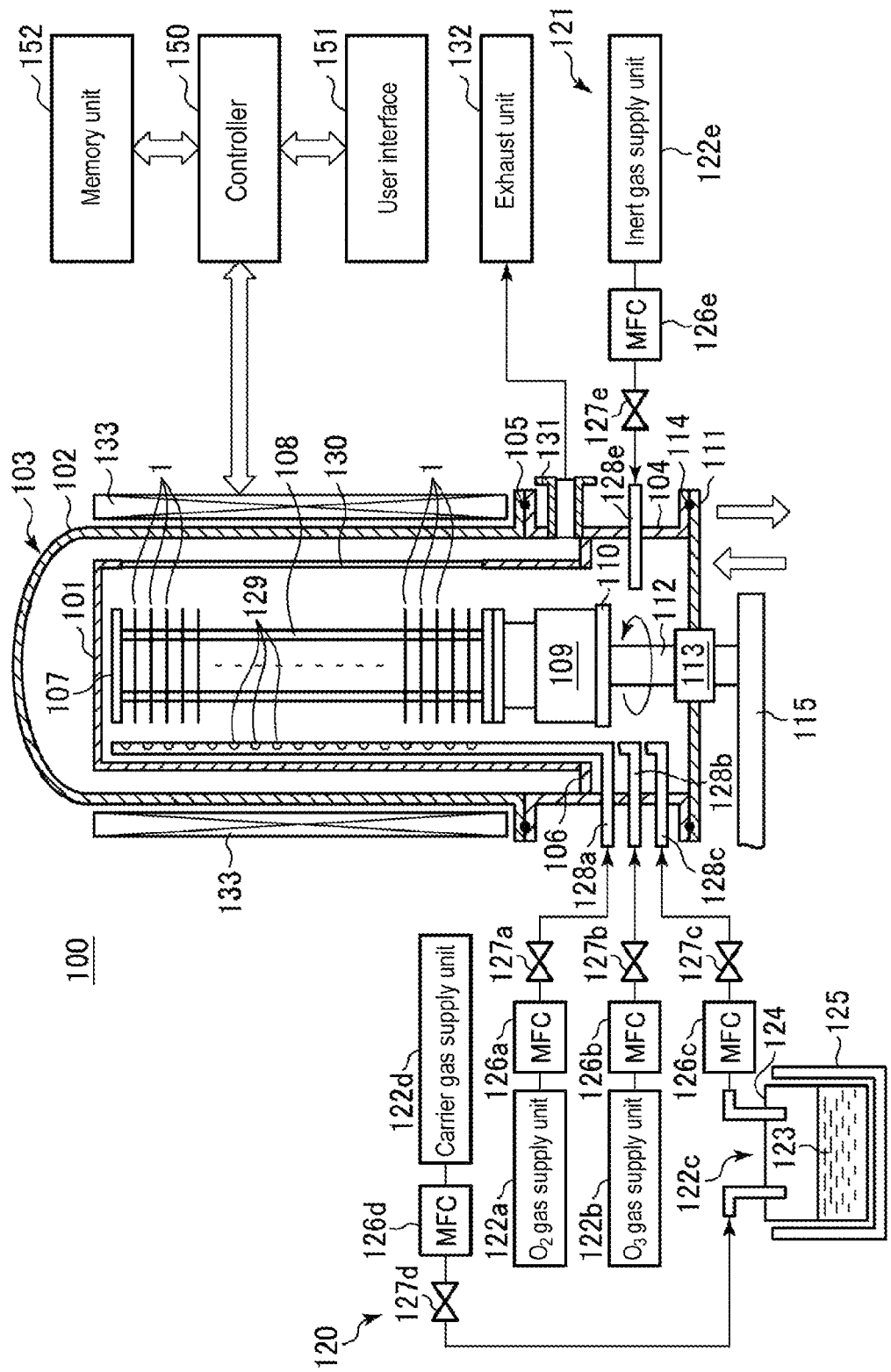
FIG. 6 is a sectional view schematically illustrating an example of a film forming apparatus according to a second embodiment of the present disclosure.

FIG. 6 is a sectional view schematically illustrating an example of the film forming apparatus according to the second embodiment of the present disclosure.

As shown in FIG. 6, a film forming apparatus 100 includes a processing chamber 103 having a double tube structure including a cylindrical inner tube 101 having an open lower end and a ceiling and an outer tube 102 concentrically disposed outside the inner tube 101. The inner tube 101 and the outer tube 102 are formed of, for example, quartz. The lower end of the outer tube 102 of the processing chamber 103 is connected to a cylindrical manifold 104, which is made of, for example, stainless steel, through a sealing member 105 such as an O-ring. Also, the inner tube 101 of the processing chamber 103 is supported on a support ring 106 installed on an inner wall of the manifold 104.

A lower end portion of the manifold 104 is open, and a vertical wafer boat 107 is inserted into the inner tube 101 through the lower end opening of the manifold 104. The vertical wafer boat 107 has a plurality of rods 108 having a plurality of support grooves (not shown) formed therein to support peripheral portions of plural sheets, for example, 50 to 100 sheets of objects to be processed, such as wafers 1 in this example. With this configuration, the vertical wafer boat 107 is mounted with the wafers 1 in a vertical multistage manner.

The vertical wafer boat 107 is mounted on a table 110 through a thermal insulation container 109 made of quartz. The table 110 is supported on a rotary shaft 112, which penetrates a lid portion 111 that opens and closes the lower end opening of the manifold 104, the lid portion 111 being made of, for example, stainless steel. A magnetic fluid seal 113, for example, is installed at a through portion in the lid portion 111 where the rotary shaft 112 penetrates the lid portion 111, so that the rotary shaft 112 is airtightly sealed and rotatably supported by the magnetic fluid seal 113. Also, a sealing member 114 such as an O-ring is interposed between a peripheral portion of the lid portion 111 and the lower end of the manifold 104, thereby maintaining the processing chamber 103 to be sealed. The rotary shaft 112 is installed at a leading end of an arm 115 supported by a lift unit (not shown) such as a boat elevator. With this configuration, the vertical wafer boat 107, the lid portion 111 and the like are lifted up or down together so that they can be inserted into or be separated from the inner tube 101 of the processing chamber 103.

The film forming apparatus 100 further includes a processing gas supply mechanism 120 that supplies a processing gas into the inner tube 101, and an inert gas supply mechanism 121 that supplies an inert gas into the inner tube 101.

The processing gas supply mechanism 120 includes an $O_2$ gas supply unit 122a as an oxidizing gas supply unit, an $O_3$ gas supply unit 122b as a modifying gas supply unit, and an organic metal gas supply unit 122c as a metal source gas supply unit. The organic metal gas supply unit 122c includes, for example, a reservoir 124 that stores a liquid source 123 in which an organic metal is melted, and a heater 125 that heats the reservoir 124. An example of the organic metal includes TMA. A carrier gas is supplied into the reservoir 124 from a carrier gas supply unit 122d through a mass flow controller (MFC) 126d and an opening/closing valve 127d. An example of the carrier gas includes nitrogen ($N_2$) gas.

The $O_2$ gas supply unit 122a is connected to a dispersion nozzle 128a through a mass flow controller (MFC) 126a and an opening/closing valve 127a. The $O_3$ gas supply unit 122b is connected to a dispersion nozzle 128b through a mass flow controller (MFC) 126b and an opening/closing valve 127b. The organic metal gas supply unit 122c is connected to a dispersion nozzle 128c through a mass flow controller (MFC) 126c and an opening/closing valve 127c.

The inert gas supply mechanism 121 includes an inert gas supply unit 122e. An example of the inert gas includes nitrogen ($N_2$) gas. The inert gas is used in purging the interior of the inner tube 101 and the like. The inert gas supply unit 122e is connected to a nozzle 128e through a mass flow controller (MFC) 126e and an opening/closing valve 127e.

The respective dispersion nozzles 128a to 128c, which are configured by quartz pipes, for example, penetrate into the manifold 104 at a sidewall of the manifold 104 and are bent to extend vertically toward the inner tube 101 within the manifold 104. That is to say, the respective dispersion nozzles 128a to 128c extend toward the ceiling of the inner tube 101. Each of the vertically extended portions of the dispersion nozzles 128a to 128c has a plurality of gas discharging holes 129 formed to be spaced apart at predetermined intervals. With this configuration, each gas is uniformly discharged in a horizontal direction toward the interior of the inner tube 101 from the gas discharging holes 129. In addition, the nozzle 128e penetrates into the manifold 104 at the sidewall of the manifold 104 and discharges the inert gas in the horizontal direction from a leading end thereof.

An exhaust port 130 configured to exhaust the interior of the inner tube 101 is formed in a portion of a sidewall of the inner tube 101 positioned opposite to the dispersion nozzles 128a to 128c. The inner tube 101 is in communication with the interior of the outer tube 102 through the exhaust port 130. The interior of the outer tube 102 is in communication with a gas outlet 131 formed in the sidewall of the manifold 104, and the gas outlet 131 is connected with an exhaust unit 132 including a vacuum pump and the like. The exhaust unit 132 exhausts the interior of the inner tube 101 through the interior of the outer tube 102 and the exhaust port 130. With this configuration, the processing gas which has been used in the process performed within the inner tube 101 is exhausted, or the internal pressure of the inner tube 101 is adjusted to a processing pressure suitable for the process.

A cylindrical heating unit 133 is installed along the outer circumference of the outer tube 102. The heating unit 133 heats the wafers 1 accommodated in the inner tube 101 while activating the gases supplied into the inner tube 101.

The control of each component of the film forming apparatus 100 is performed, for example, by a controller 150 configured by a microprocessor (computer). The controller 150 is connected with a user interface 151. The user interface 151 includes a touch panel through which an operator performs command input operations and the like to control the film forming apparatus 100, a display that visualizes and displays the operational status of the film forming apparatus 100, and the like.

A memory unit 152 is connected to the controller 150. The memory unit 152 stores a control program for implementing various processes performed in the film forming apparatus 100 under the control of the controller 150, and stores a program, i.e., a recipe, for having the respective components of the film forming apparatus 100 perform a process according to processing conditions. The recipe is stored, for example, in a storage medium of the memory unit 152. The storage medium may be a portable memory such as a CD-ROM, DVD or flash memory, as well as a hard disk or semiconductor memory. Alternatively, the recipe may be suitably transmitted from other devices, for example, through a dedicated line. The recipe, if necessary, is read from the memory unit 152 by instructions or the like from the user interface 151 and a process according to the read recipe is performed by the controller 150, so that a desired film forming process, for example, Steps S1 to S11 described with reference to FIG. 1, is performed under the control of the controller 150.

The metal oxide film forming method according to the first embodiment of the present disclosure, for example, may be performed by the film forming apparatus 100 as shown in FIG. 6.

Although some embodiments of the present disclosure have been described for illustrative purposes, the present disclosure is not limited to the embodiments, and various modifications and changes can be made thereto within the scope of the disclosure without departing from the essential features of the disclosure.

For example, while it has been described in the above-described embodiments that $C_{11}H_{29}N_4Al$((2-dimethylaminoethylmethylamino)bis(ethylmethylamino)aluminum) is used as the organic metal that is a source of the metal oxide film, the organic metal as the source is not limited to $C_{11}H_{29}N_4Al$. For example, instead of $C_{11}H_{29}N_4Al$, the following organic metals may be used as the metal source of the metal oxide film:

Trimethyl aluminum (TMA),
Tris(dimethylamido)aluminum (TDMAA),
Aluminum chloride ($AlCl_3$), or
$C_XH_YN_ZAL$ (where X is 11 to 17, Y is 29 to 88, and Z is 1 to 6).

In the above-described embodiments, the batch type film forming apparatus 100, in which a plurality of wafers 1 is mounted and subjected to the film forming process at a single time, has been illustrated as the film forming apparatus for performing the present disclosure. However, the film forming apparatus is not limited to the batch type and may be a single-wafer film forming apparatus that processes semiconductor wafers one by one.

The object to be processed is not limited to the wafer 1, and the present disclosure may be applied to other substrates including an LCD glass substrate and the like. In addition, the present disclosure may be variously modified within the scope of the disclosure without departing from the essential features of the disclosure.

According to the present disclosure, it is possible to provide a metal oxide film forming method, wherein a metal oxide film having a low concentration of impurity such as carbon can be obtained without damaging uniformity in film thickness, and a film forming apparatus capable of performing the method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A metal oxide film forming method, comprising:

repeating a cycle a first predetermined number of times, the cycle including supplying a gas containing an organic metal precursor into a processing chamber where an object to be processed is accommodated, and supplying oxygen gas into the processing chamber after the gas containing the organic metal precursor is supplied into the processing chamber; and supplying only ozone gas into the processing chamber after repeating the cycle to obtain a modified metal oxide layer, wherein a temperature in supplying the ozone gas is equal to or higher than 300 degrees C. and lower than 350 degrees C., and wherein repeating the cycle and supplying the ozone gas are repeated a second predetermined number of times, so that a metal oxide film is formed on a surface of the object to be processed.

2. The method of claim 1, wherein repeating the cycle the first predetermined number of times includes repeating a deposition of a metal layer on the surface using the organic metal precursor as a source and an oxidization of the deposited metal layer into a metal oxide layer, so that a plurality of metal oxide layers is obtained, wherein supplying the ozone gas includes modifying the plurality of metal oxide layers, which are obtained by repeating the cycle the first predetermined number of times, using the ozone gas so that the modified metal oxide layer is obtained, and wherein the metal oxide film is formed by repeatedly performing repeating the cycle and supplying the ozone gas the second predetermined number of times, so that a plurality of modified metal oxide layers is stacked as the metal oxide film up to a set thickness.

3. The method of claim 2, wherein modifying the plurality of metal oxide layers includes decreasing concentrations of carbon and hydrogen, which are contained in at least the organic metal precursor, in the plurality of metal oxide layers, and increasing a density of the plurality of metal oxide layers.

4. The method of claim 1, wherein a processing time in supplying the ozone gas is equal to or more than 60 sec and equal to or less than 120 sec.

5. The method of claim 1, wherein the organic metal precursor includes an organic aluminum precursor.

6. The method of claim 1, wherein the organic metal precursor includes an organic aluminum precursor containing carbon, hydrogen, nitrogen and aluminum.

* * * * *